US012633821B2

(12) United States Patent
Wang et al.

(10) Patent No.: US 12,633,821 B2
(45) Date of Patent: May 19, 2026

(54) POWER MODULE FOR A POWER CONVERTER WITH OPTIMIZED SIGNAL PINS

(71) Applicant: ZF Friedrichshafen AG, Friedrichshafen (DE)

(72) Inventors: Pengshuai Wang, Eriskirch (DE); Michael Kohr, Bodnegg (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 405 days.

(21) Appl. No.: 18/162,820

(22) Filed: Feb. 1, 2023

(65) Prior Publication Data

US 2023/0246544 A1    Aug. 3, 2023

(30) Foreign Application Priority Data

Feb. 1, 2022    (DE) .......................... 102022201016.7

(51) Int. Cl.
| | |
|---|---|
| *H05K 7/02* | (2006.01) |
| *B60L 50/60* | (2019.01) |
| *H02M 3/00* | (2006.01) |
| *B60K 6/22* | (2007.10) |

(52) U.S. Cl.
CPC ............. *H02M 3/003* (2021.05); *B60L 50/60* (2019.02); *H05K 7/02* (2013.01); *B60K 6/22* (2013.01); *B60L 2210/10* (2013.01); *B60L 2210/40* (2013.01); *B60Y 2200/91* (2013.01); *B60Y 2200/92* (2013.01)

(58) Field of Classification Search
USPC ......................... 361/807, 728, 730, 809, 810
See application file for complete search history.

(56) References Cited

U.S. PATENT DOCUMENTS

| | | | |
|---|---|---|---|
| 2003/0106924 A1 | 6/2003 | Nobori et al. | |
| 2014/0246783 A1 | 9/2014 | Nishizawa et al. | |
| 2020/0044373 A1* | 2/2020 | Yamanaka | ............. H01R 12/58 |
| 2020/0066686 A1* | 2/2020 | Mohn | ................... H01L 25/072 |

(Continued)

FOREIGN PATENT DOCUMENTS

| | | |
|---|---|---|
| DE | 102016224586 A1 | 6/2017 |
| DE | 102020211008 A1 | 3/2021 |

(Continued)

OTHER PUBLICATIONS

Office Action dated Sep. 8, 2022 for German Patent Application No. 10 2022 201 016.7 (14 pp.), note: pp. 1 and 2 are English language Explanations to Section C. Result of Determination Document.

*Primary Examiner* — Hung S. Bui
(74) *Attorney, Agent, or Firm* — Crowell & Moring LLP

(57) ABSTRACT
A power module for supplying electricity to an electric axle drive in an electric vehicle and/or hybrid vehicle may include numerous semiconductor switches for receiving an input current and generating an output current on the basis of the received input current by switching the semiconductor switches, where the semiconductor switches each have a positive current electrode, negative current electrode, and a control electrode, where numerous signal pins are each conductively connected to one of the electrodes, where at least one of the signal pins extends vertically, at least in part, between the electrode connected thereto and a driver.

12 Claims, 4 Drawing Sheets

(56) References Cited

U.S. PATENT DOCUMENTS

2020/0112111 A1 * 4/2020 Truessel ............ H01L 23/49811
2021/0313296 A1 * 10/2021 Raimann .............. H01L 25/072
2021/0344276 A1 * 11/2021 Raimann .......... H01L 23/49562

FOREIGN PATENT DOCUMENTS

JP          2010-283107  A     12/2010
WO      WO-2018193929  A1 * 10/2018   ............ H10K 39/10
WO      WO 2021/245915  A1    12/2021

* cited by examiner

POWER MODULE FOR A POWER CONVERTER WITH OPTIMIZED SIGNAL PINS

RELATED APPLICATION

This application claims the benefit of, and priority to, German Patent Application DE 10 2022 201 016.7, filed Feb. 1, 2022, which is hereby incorporated by reference herein in its entirety.

TECHNICAL FIELD

The invention relates to a power module for a power converter, in particular for an inverter, for supplying electricity to an electric axle drive in an electric vehicle or hybrid vehicle, a corresponding power converter, in particular an inverter, a corresponding electric axle drive that has such a power converter, and a corresponding vehicle that has such an electric axle drive.

BACKGROUND

There are purely electric vehicles and hybrid vehicles in the prior art that are powered exclusively or partially by one or more electric machines functioning as the drive assembly. To supply the electric machines in these electric or hybrid vehicles with electricity, the electric and hybrid vehicles contain electric energy storage units, in particular rechargeable batteries. These batteries are DC power sources, while the electric machines normally require AC power. For this reason, a power electronics unit with a so-called inverter is normally interconnected between the battery and the electric machine in an electric or hybrid vehicle.

These inverters normally comprise semiconductor switches, typically in the form of transistors, e.g. MOSFETs or IGBTs. The semiconductor switch can be designed as so-called half bridges, which have a high side and a low side. These high sides and low sides comprise one or more semiconductor switches connected in parallel, which are activated in a targeted manner when in operation in order to convert a DC input into numerous temporally offset phase currents for an AC output, wherein the phase currents can each be altered temporally and are normally in the form of a sine wave.

The semiconductor switches are preferably transistors, such as MOSFETs or IGBTs, each of which have electrodes for subjecting the respective semiconductor switches to a switching current (current electrodes) and for inputting a switching signal (control electrodes), in order to conduct or block the switching current. Signal pins are used for signal transfer of the switching signals, which are connected at one end to the control electrodes and at the other end to a driver, which comprises a printed circuit board populated with driver components.

In the inverters known from the prior art, signal transfer is frequently delayed due to the large distance between the electrodes and driver, which results in an increased resistance in the signal lines. Furthermore, this results in a high level of leakage inductance, which leads to voltage fluctuations or jumps.

BRIEF DESCRIPTION OF THE DRAWINGS

Certain embodiments shall be explained in greater detail below on the basis of the embodiments shown in drawings.

Therein.

DETAILED DESCRIPTION

Figure 1:
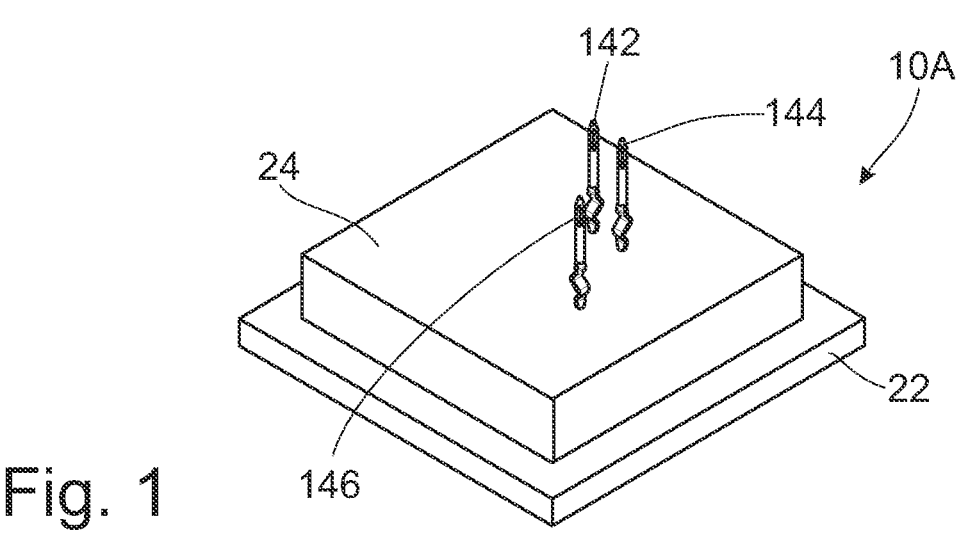
FIGS. 1-3 show numerous schematic illustrations of a power module according to one embodiment, in two perspective views and in a sectional side view.

A feature/object of the present disclosure, in view of the background above, is providing a power converter, in particular an inverter, with which the disadvantages specified above are at least partially eliminated.

This object is achieved according to the invention by the power module, the power converter, the electric axle drive, and the vehicle.

The invention relates to a power module for a power converter, in particular an inverter, for operating an electric axle drive in an electric vehicle and/or hybrid vehicle. The power module comprises numerous semiconductor switches for receiving input current, and generating an output current on the basis of the received input current through the switching of the semiconductor switches. The power converter is preferably a DC/AC inverter. In this case, the input current is a DC input from a DC power source, and the output current is an AC output that has numerous phase currents. Alternatively, the power converter can be a DC/DC rectifier. In this case, the input current is a DC input from a DC voltage source, and the output current is a DC output that differs from the DC input, which is preferably intended for charging a vehicle battery.

The semiconductor switches are preferably transistors, e.g. MOSFETs and/or IGBTs. The semiconductor material forming the basis of the semiconductor switches is preferably silicon or a so-called wide-bandgap semiconductor, e.g. silicon carbide, gallium nitride, or gallium oxide.

The semiconductor switches each have a positive current electrode (e.g. emitter electrode or source electrode), a negative current electrode (e.g. collector electrode or drain electrode), and a control electrode (e.g. gate electrode). Numerous signal pins are also connected to each electrode in an electrically conductive manner. The signal pins are preferably press-fit pins, each of which has a shaft section that is pressed into a printed circuit board in a driver. After inserting the press-fit pins, they are secured in the printed circuit board in a form-fitting and/or force-fitting manner, such that the signal pins are securely fixed in place, and a reliable signal transfer is ensured.

According to the invention, at least one of the signal pins extends, at least in part, vertically from the electrode connected thereto to the driver or printed circuit board. This shortens the distance between the electrodes and the driver or printed circuit board, thus decreasing the signal transfer resistance. Any delays in the signal transfer can be effectively reduced in this manner. The activation of the semiconductor switches is advantageously more reliable. In addition, the leakage inductance in the power module is reduced with decreased signal transfer distances. Leakage inductance leads to voltage fluctuations and jumps when the semiconductor switches are constantly switched on and off, which can negatively impact the functionality of the semiconductor switches and thus the overall power converter, or inverter. With decreased leakage inductance, this functional impairment is therefore reduced. Because the relationship of the leakage inductance to the voltage fluctuations or jumps is proportional to the switching speeds, WBS semiconductor materials with particularly rapid switching speeds can be used in the invention, without the leakage inductance resulting in high switching losses.

According to one embodiment, the signal pin is curved in the middle in the form of an S, or a wave. The S-shaped, or wave-shaped intermediate segment is part of the shaft segment of the signal pin, which is designed to have a spring effect when pushing or pressing the signal pin against the printed circuit board in the driver. This protects the signal pin more effectively against tensions or even breaking.

According to another embodiment, the at least one signal pin has a foot segment that takes the form of a step, is S-shaped, plate-shaped, and/or cylindrical. The foot segment braces the signal pin against the electrode connected thereto when the signal pin is inserted or pressed into the printed circuit board. The step-shaped or S-shaped foot segment can be an integral bend in the signal pin at the bottom, or it can be attached thereto.

According to another embodiment, the electrodes each have a connecting point to the signal pins, wherein the connecting points are arranged in a triangle. This means that the connecting points are not in a straight line, such that a line connecting the connecting points would form a triangle. This results in a particularly robust structure for the signal pins. The connecting points preferably have this configuration when the si333gnal pins are bent at the foot end in the manner described above.

According to another embodiment, the signal pins are connected to one another with insulating plastic connectors. The plastic connectors provide for a more robust positioning of the signal pins, while simultaneously separating the potentials and signals between the signal pins. Advantageously, there is no need to connect the signal pins to a lead frame in the power module, making it easier to replace the lead frames.

According to another embodiment, the at least one signal pin is connected to a mount at a lower end facing an electrode connected thereto with a form-fitting and/or force-fitting connection. This also increases the positional stability of the signal pin such that it remains in place. The mount can be a signal-conducting mount with a hollow space at the bottom for receiving the lower end of the shaft segment, wherein the shaft segment can be spaced apart from the lower edge of the hollow space when it is received therein. The signal transfer takes place in this case through both the mount and the shaft segment. Alternatively, the mount can have a plastic platform that is preferably supported on a substrate, to which the semiconductor switches are connected at the bottom. In this case, the signal pin(s) can extend upward from the electrodes through the plastic platform.

According to another embodiment, the at least one signal pin is connected in an insulated manner at the side to a lead frame with a form-fitting and/or force-fitting connection, wherein the lead frame comprises numerous conductors subjected to a switching current. The lead frame can also have numerous power connectors for receiving the DC input and outputting the AC power, which are electrically connected to the conductors. The connection between the signal pin and the lead frame, which is both insulating as well as form-fitting or force-fitting, can be obtained with a plastic casing, in particular a plastic casing and/or plastic coating of the lead frame at the connecting points to the signal pin(s).

According to another embodiment, the power module is a half bridge module with a high side and a low side, wherein the high side and low side each have one or more semiconductor switches connected in parallel. In this case, the half bridge module itself can function as a complete half bridge. Alternatively, numerous half bridge modules can be combined to form an extended half bridge with respect to the maximum amount of current it can withstand. The high sides of the modules are connected in parallel in order to form a high side of the combined half bridges. The low sides of the modules are also connected in parallel in order to form a low side of the combined half bridges. In a power converter, in particular an inverter, numerous of these combined half bridges, e.g. three, can be used, in which each combined half bridge forms a single phase unit, at the output of which one of numerous phase currents in the AC output is generated.

The invention also relates to a power converter for supplying electricity to an electric axle drive, in particular an electric machine therein that has such a power module, a corresponding electric axle drive, and a vehicle that has such an electric axle drive. The power converter can contain an inverter or a rectifier. This also results in the advantages described above in conjunction with the power module according to the invention for the power converter according to the invention, the electric axle drive according to the invention, and the vehicle according to the invention.

The same objects, functional units and comparable components have the same reference symbols in all of the figures. These objects, functional units, and comparable components are identical with respect to their technical properties, as long as it not otherwise explicitly or implicitly indicated in the description.

Figure 2:
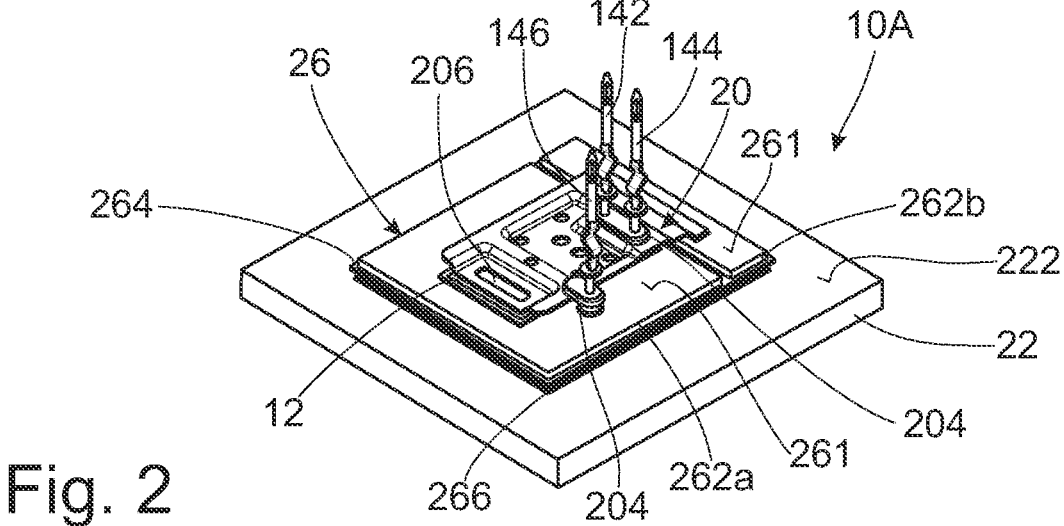
Figure 3:
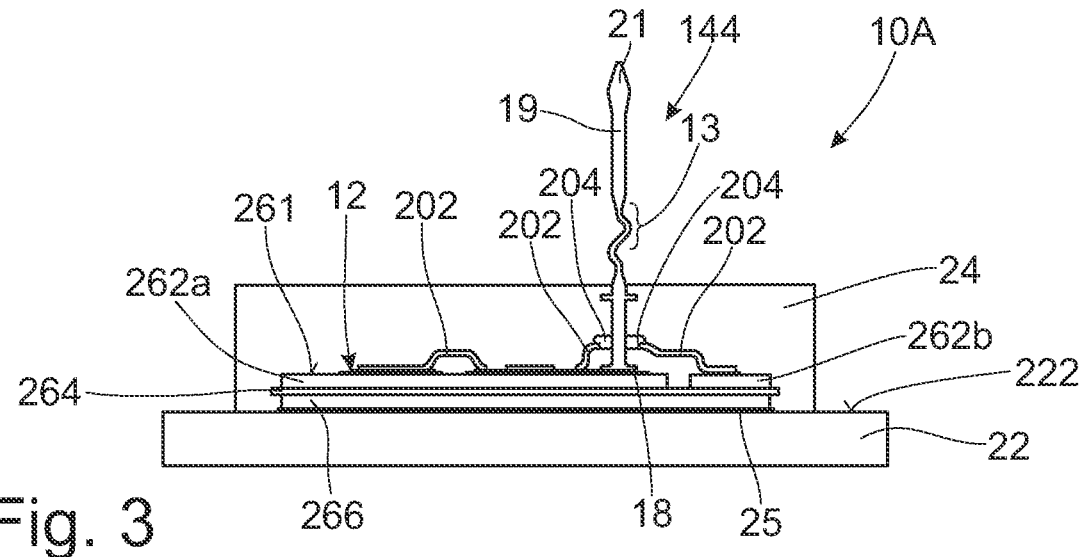

FIGS. 1-3 show a power module 10A according to one embodiment, in each case in a schematic illustration. The power module 10A is designed for use with a power converter. The power converter is preferably a DC/AC inverter that generates an AC output with numerous phase currents from a DC input from a DC voltage source (e.g. a battery). Alternatively, the power converter is a DC/DC rectifier that converts a DC input voltage into a different DC output voltage.

FIG. 1 shows the power module 10A in a schematic perspective view. The power module 10A comprises numerous semiconductor switches 12, which are encased with an insulating material, as shown in FIG. 1, preferably through a coating process. In FIG. 2, the construction of the power module 10A inside the coating 24 is shown schematically. Instead of a molten coating 24, grouting can also be used. The semiconductor switches 12 are attached to a substrate 26, which is a multi-layer structure that has a first metal layer 262a-b, a second metal layer 266, and an insulating layer 264 therebetween. The semiconductor switches 12 are attached to the first metal layer 262a-b by means of sintering and/or soldering, and/or an adhesive. The first (upper) metal layer 262a-b is divided into to areas. The semiconductor switches 12 are located in the first area 262a, while in the second area, just one of the conductors 202 is electrically connected to the substrate 262. A lead frame 20 is placed on top of the semiconductor switches 12, which has numerous conductors 202. Numerous electrodes (not shown herein) can be electrically connected to the semiconductor switches 12 via these conductors 202 from the outside, in order to receive DC input power, for example, and output the AC output power or phase currents to an electric machine for the electric axle drive. The lead frame 20 is preferably connected, as shown schematically in FIG. 2, to the semiconductor switches 12 and the substrate 26 by means of a sintering layer 206. As shown schematically in FIG. 3, the second (lower) metal layer 266 is connected to an upper surface 222 of a heat sink 22 by means of a sintering layer 26, which is designed to absorb or discharge any heat generated in the power module 10A. Alternatively, an adhesive layer, solder layer, or some other bonding agent can be used for this.

There are numerous signal pins (three in this case, by way of example) 142, 144, 146 in the power module 10A, which extend vertically from the electrodes in the semiconductor switch 12 to an upper surface 261 of the first metal layer 262a. The signal pins 142, 144, 146 are designed to convey control signals in the form of electric voltage/current/pulses, provided by a driver in the power converter (not shown herein), to the electrodes in the individual semiconductor switches 12. A first signal pin 142 is electrically connected to the control electrode, in this case in the form of a gate electrode, in order to transfer control signals (gate signals) to the control electrodes. Another signal pin 144 is electrically connected to the positive current electrode, in this case in the form of an emitter electrode, by way of example. A third signal pin 146 is electrically connected to the first metal layer 262a functioning here as the negative electrode, or collector electrode, by way of example. The second signal pin 144 and third signal pin 146 are designed to receive current signals from the respective semiconductor switches 12, in order to adjust the gate signal for the purpose of optimizing a sine wave AC phase current on the basis thereof, by way of example.

The signal pins 142, 144, 146 all have the same design here, and each have a head segment 21, a foot segment 18, and a shaft segment 19 therebetween. The signal pins 142, 144, 146 are all designed as press-fit pins in this embodiment, by way of example. The head segment 21 has a greater diameter than the shaft segment 19, which results in a reliable force-fitting connection in the driver (or its printed circuit board) after inserting or pressing the signal pins 142, 144, 146 therein. The shaft segment 19 has an S-shaped intermediate segment 13, as shown more clearly in FIG. 3, which dampens vibrations of the signal pins 142, 144, 146 when inserting or pressing them into the driver, and absorbs any tensions. The foot segment 18 in this embodiment is plate-shaped, and has a greater diameter than the shaft segment 19, allowing for a secure bracing against the electrodes connected to the respective signal pins 142, 144, 146. The signal pins 142, 144, 146 are also connected to the lead frames 20 with a coating 204, which further improves the positional stability of the signal pins 142, 144, 146 such that they remain in place. This can also reduce or prevent the forces acting on the semiconductor switch 12.

Figure 4:
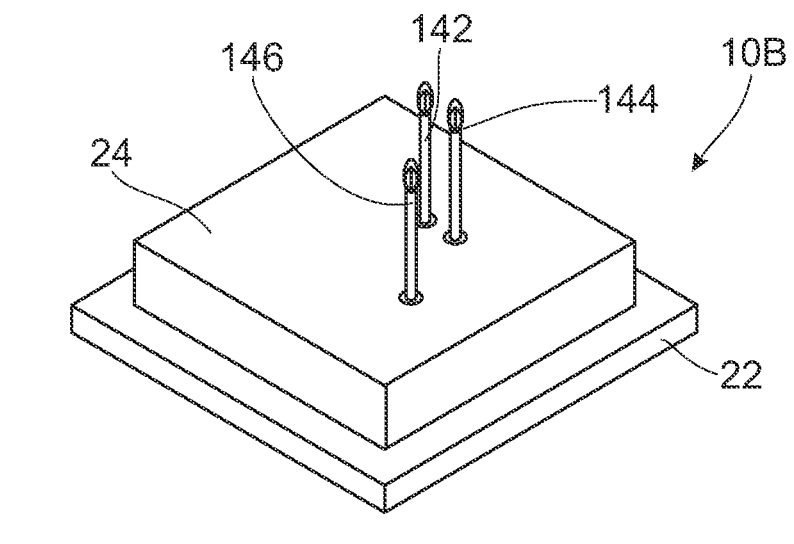
FIGS. 4-6 show numerous schematic illustrations of a power module according to another embodiment in two perspective views and in a sectional side view.
Figure 5:
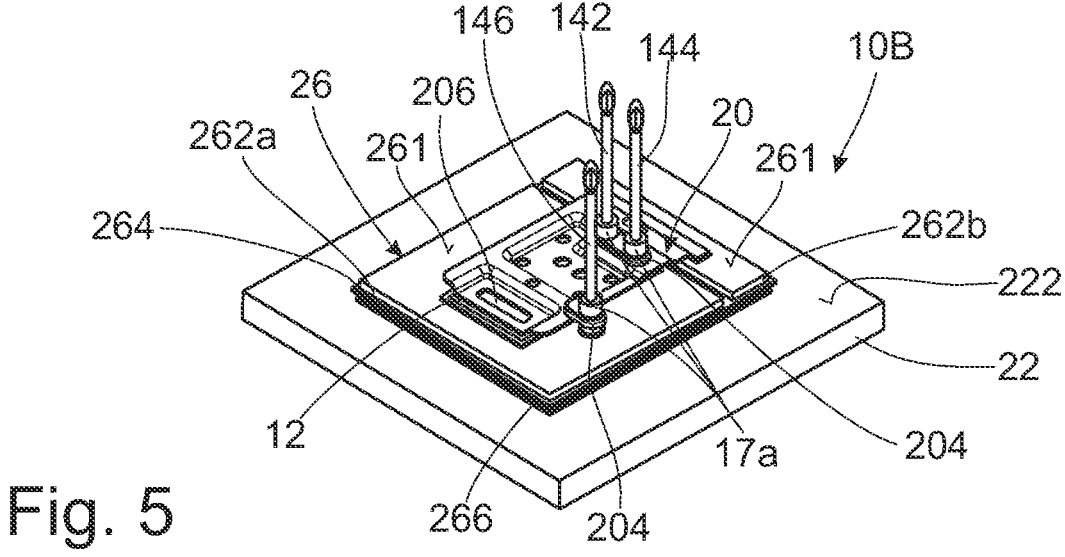
Figure 6:
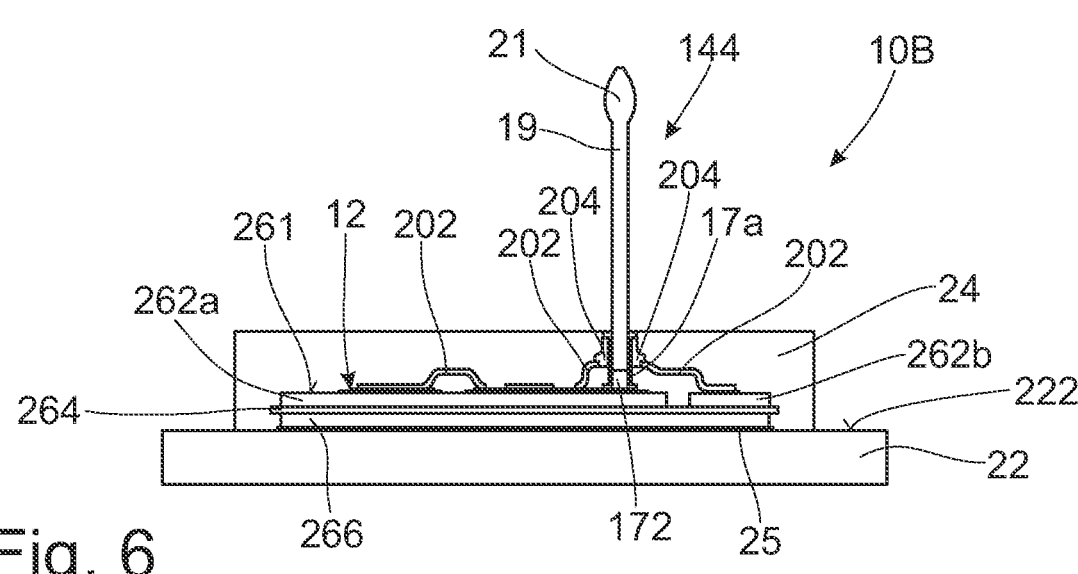

FIGS. 4-6 show a power module 10B according to another embodiment, in each case in a schematic illustration. The structure of the power module 10B is similar to that of the embodiment shown in FIGS. 1-3. With regard to features that remain the same, reference is therefore made to description of the embodiment shown therein. Only the differences in the power module 10B to the embodiment described above shall be explained below.

The signal pins 142, 144, 146 also have a head segment 21 and a middle shaft segment 19. Unlike in the embodiment described in reference to FIGS. 1-3, instead of a foot segment, there is a mount 17a, which forms a cylinder with a hollow space 172, by way of example, into which the shaft segment 19 enters from above, and is received in a form-fitting manner. The casing or coating 204 applied to the lead frame is not directly connected to the shaft segment 19, as is the case in the embodiment shown in FIGS. 1-3, but instead is connected to the cylindrical mount 17a. The mount 17a preferably has two vertical, opposing end walls, as shown schematically in FIGS. 5-6. The upper end wall delimits the coating 204 on the lead frame 20 at the upper surface, and the lower end wall braces the respective signal pin 142, 144, 146 against the electrodes in order to improve the positional stability and keep them in place. The mount 17a is a signal-conducting mount, which allows for signal transfer between the driver and the electrodes through both the respective signal pin and the mount 17a.

The mount 17a can also absorb forces generated when inserting a signal pin. After the insertion, the signal pin is prevented from sliding further in by friction, thus also reducing any other forces acting on the signal pin.

Figure 7:
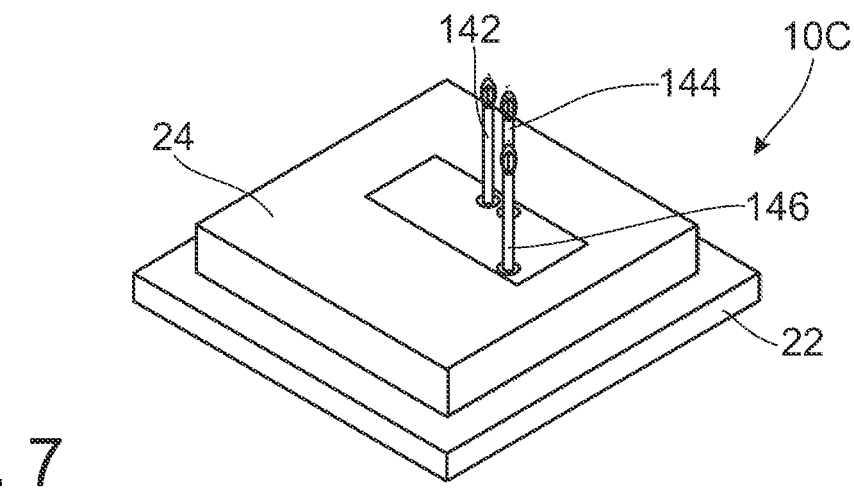
FIGS. 7-9 show numerous schematic illustrations of a power module according to another embodiment in two perspective views and in a sectional side view.
Figure 8:
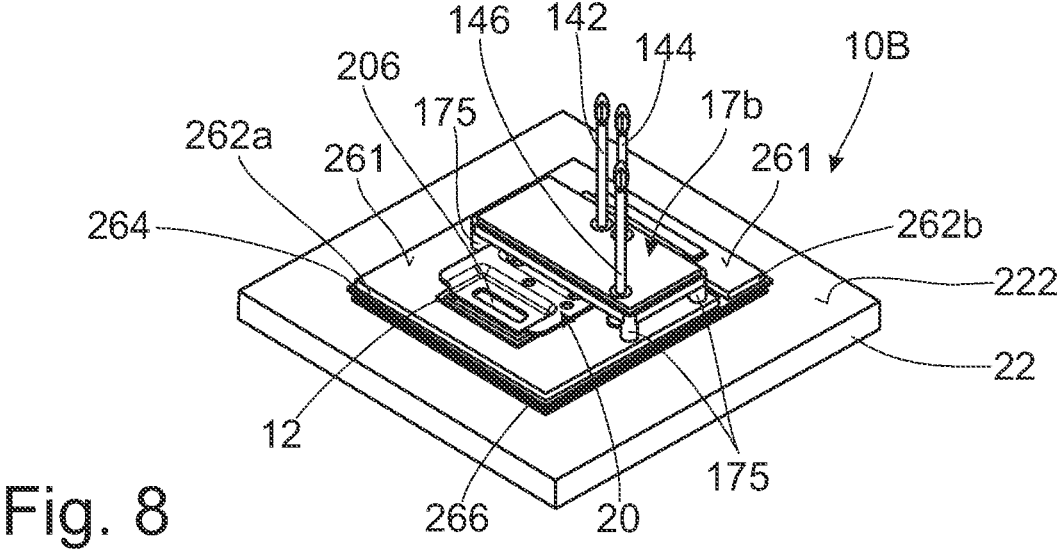
Figure 9:
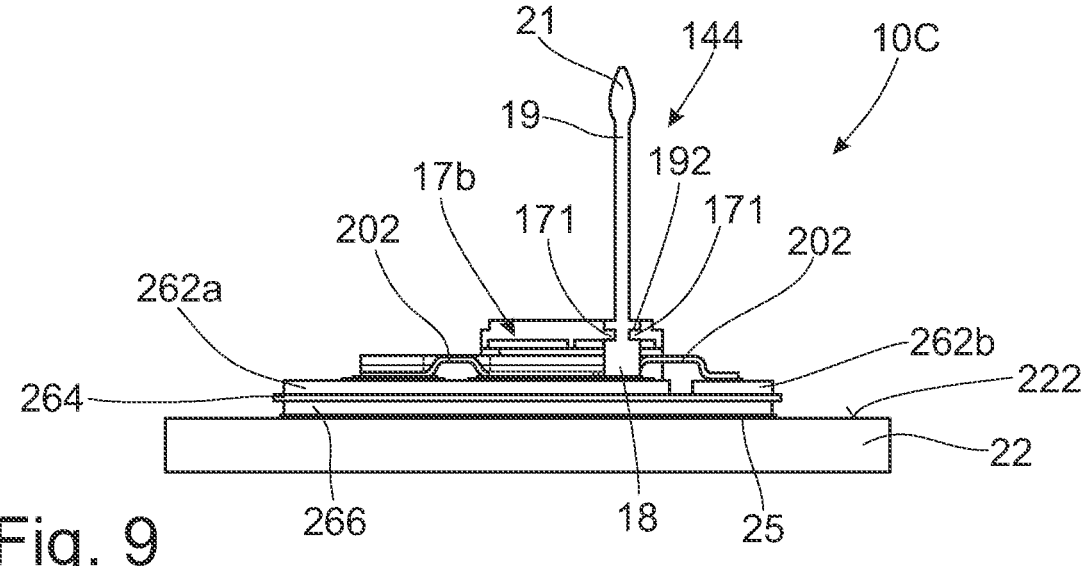

FIGS. 7-9 show a power module 10C according to another embodiment, in each case in a schematic illustration. The structure of the power module 10C is similar to that of the embodiments shown in FIGS. 1-3 and FIGS. 4-6. With regard to features that remain the same, reference is therefore made to description of the embodiments shown therein. Only the differences in the power module 10C to the embodiments described above shall be explained below.

The signal pins 142, 144, 146 also have a head segment 21 and a middle shaft segment 19. Unlike in the embodiment described in reference to FIGS. 1-3, instead of a flat plate-shaped foot segment, there is a higher foot segment 18 here, which is cylindrical, by way of example. This enables a secure connection to the signal pins 142, 144, 146 at the bottom, such that when inserting or pressing the signal pins 142, 144, 146, preferably in the form of press-fit pins, into the printed circuit board in the driver, any negative impacts on the signal pins 142, 144, 146 such as breakage, are effectively prevented.

Furthermore, the signal pins 142, 144, 146 are not in an insulated, mechanical connection to the lead frames 20, but instead are held in place by a mount in the form of a plastic platform 17b. The plastic platform 17b comprises a rectangular plate with numerous feet 175 with which the platform is supported on the upper surface 261 of a substrate 26, by way of example. The feet 175 also deflect forces acting on the signal pins through the platform into the first metal layer 262a-b. As a result, forces that could act on the semiconductor switches 12 are also reduced or prevented. The signal pins 142, 144, 146 each have a shoulder 192, which extends laterally outward from the shaft segment 19. The plastic platform 17b is preferably formed by coating the signal pins with a plastic. In this manner, a lug 171 is formed in the side view shown in FIG. 9, or in the cross section, which engages between the shoulder 192 and the cylindrical foot segment 18. This results in a better retention of the plastic platform 17b. Furthermore, the plastic platform 17b mechanically connects the signal pins 142, 144, 146 to one another in an insulated manner with regard to electricity and signals transfer, and results in greater positional stability and secures the signal pins 142, 144, 146 in place. They can also be sealed by the coating.

Figure 10:
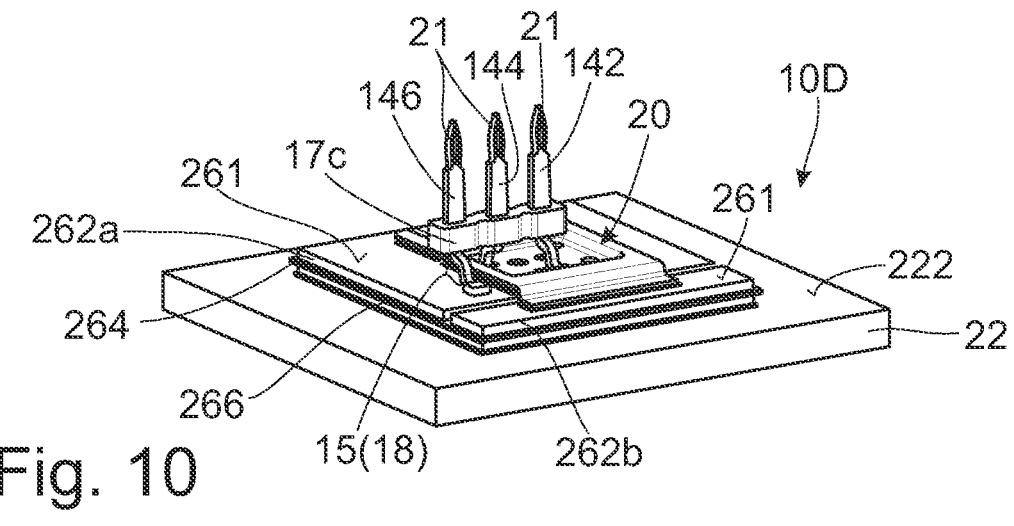
FIGS. 10-12 show numerous schematic illustrations of a power module according to another embodiment in a perspective view, from above, and in a sectional side view.
Figure 11:
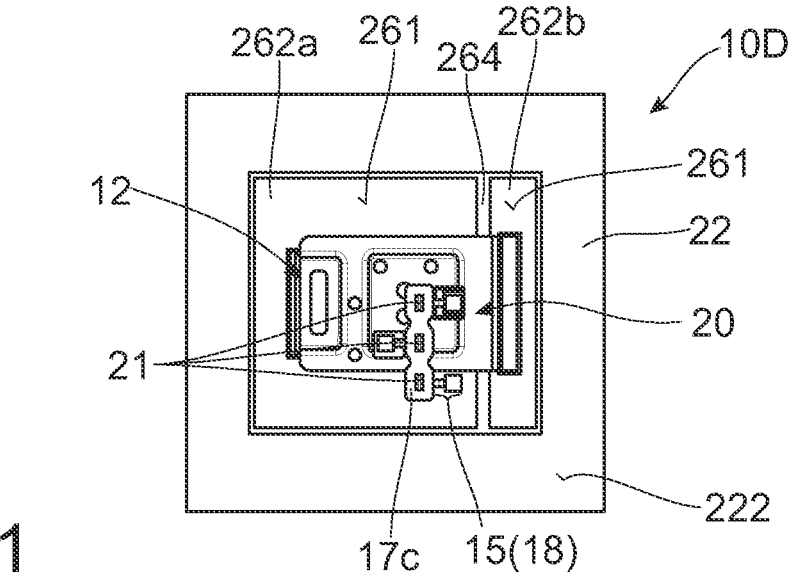
Figure 12:
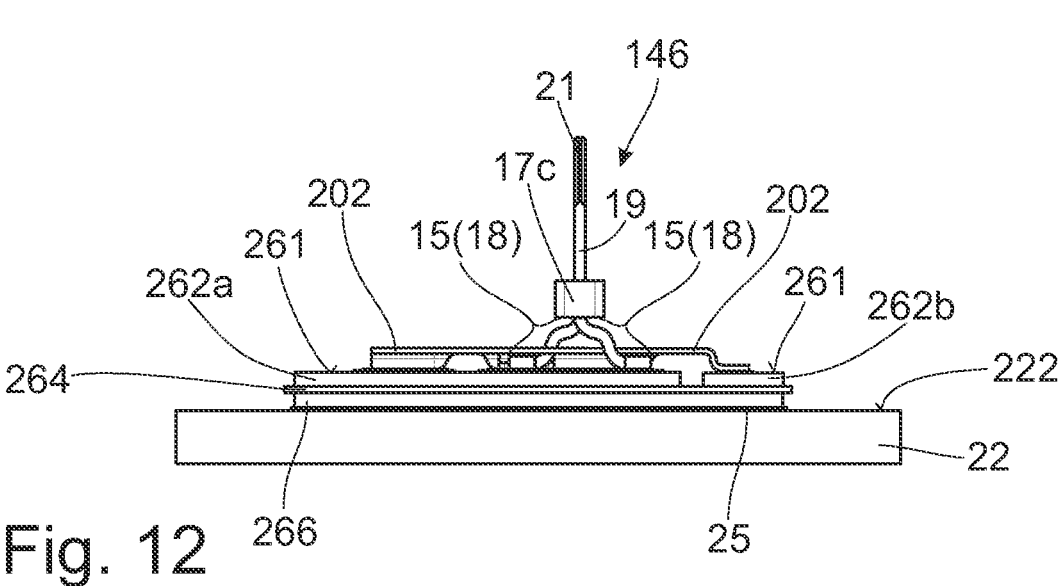

FIGS. 10-12 show a power module 10D according to another embodiment, in each case in a schematic illustration. The structure of the power module 10D is similar to that of the embodiments shown in FIGS. 1-3, FIGS. 4-6, and FIGS. 7-9. With regard to features that remain the same, reference is therefore made to description of the embodiments shown therein. Only the differences in the power module 10D to the embodiments described above shall be explained below.

The signal pins 142, 144, 146 also have a head segment 21 and a middle shaft segment 19 and a foot segment 18. Unlike in the embodiment described in reference to FIGS. 1-3, instead of a flat, plate-shaped foot segment, the foot segment 18 here is S-shaped or stepped. This results in a connection to the signal pins 142, 144, 146 at the bottom that absorbs tensions and dampens vibrations. The signal pins 142, 144, 146, preferably in the form of press-fit pins, can be inserted or pressed into the printed circuit board in the driver more reliably, with less risk of impact to the signal pins 142, 144, 146. The S-shaped or stepped foot segment 18 is preferably obtained by a bending of the respective signal pin 142, 144, 146 that is formed integrally with the shaft segment 19. The connecting points on the foot segment 18 are arranged in a triangle corresponding to the positions of the electrodes. This triangular arrangement increases the positional stability and secures the signal pins 142, 144, 146 in place in the power module 10D.

The signal pins 142, 144, 146 are also not mechanically connected to the lead frame 20 in an insulated manner, but instead are mechanically connected to one another by a plastic connector 17c, which insulates them with regard to electricity and signal transfer. The plastic connector 17c has preferably three holes for the signal pins 142, 144, 146 arranged in a straight line. This further improves the positional stability, and secures the signal pins 142, 144, 146 in place in the power module 10D.

The plastic connector 17c also functions as a seal during the coating process. Because plastic connector 17c is preferably cast directly onto the signal pins, an effective seal is obtained.

REFERENCE SYMBOLS

10A-D power module
12 semiconductor switch
13 S-shaped/wave-shaped intermediate segment
142, 144, 146 signal pins
15 bend
17a signal-conducting mount
17b plastic platform
17c plastic connector
171 lug
172 hollow space
175 foot
18 foot segment
19 shaft segment
192 shoulder
20 lead frame
202 conductor
204 coating
206 sintering layer
21 head segment
22 heat sink
222 upper surface
24 coating
25 sintering layer
26 substrate
261 upper surface
262a,b first metal layer
264 insulating layer
266 second metal layer

The invention claimed is:

1. A power module for a power converter for supplying electricity to an electric axle drive in an electric vehicle and/or hybrid vehicle, comprising:
a plurality of semiconductor switches for receiving an input current and generating an output current on the basis of the received input current by switching the semiconductor switches,
wherein the semiconductor switches each have a positive current electrode, negative current electrode, and a control electrode,
wherein a plurality of signal pins are each conductively connected to one of the electrodes,
wherein at least one signal pin of the plurality of signal pins extends vertically, at least in part, between the respective electrode connected thereto and a driver,
wherein at least one signal pin of the plurality of signal pins is connected in an electrically insulated manner at a side of the at least one signal pin to a lead frame with a force-fitting and/or form-fitting connection, and
wherein the lead frame comprises a plurality of conductors subjected to a switching current.

2. The power module according to claim 1, wherein at least one of the signal pins has an S-shaped and/or wave-shaped intermediate segment in the middle.

3. The power module according to claim 1, wherein at least one of the signal pins has a foot segment that is stepped, S-shaped, plate-shaped, and/or cylindrical.

4. The power module according to claim 1, wherein the electrodes each have a connecting point to the plurality of signal pins, and wherein the connecting points are arranged in a triangle.

5. The power module according to claim 1, wherein the signal pins are connected to one another in an insulated manner by a plastic connector.

6. The power module according to claim 1, wherein at least one signal pin of the plurality of signal pins is connected to a mount with a force-fitting and/or form-fitting connection at a lower end facing the electrode connected thereto.

7. The power module according to claim 1, wherein the mount is either a signal-conductor mount with a hollow space for receiving a lower end of the shaft segment of at least one signal pin of the plurality of signal pins, or a plastic platform.

8. The power module according to claim 1, wherein a mount and a plastic connector, each of which are dedicated to at least one signal pin of the plurality of signal pins, seal the foot of the at least one signal pin in a coating process.

9. The power module according to claim 1, wherein the power module forms a half bridge module with a high side and a low side, wherein the high side and low side each comprise one or more semiconductor switches connected in parallel.

10. A power converter, in particular an inverter, for supplying electricity to an electric axle drive in an electric vehicle and/or hybrid vehicle, comprising one or more power modules according to claim 1.

11. An electric axle drive for a vehicle, in particular an electric vehicle or hybrid vehicle, comprising an electric machine, a transmission, and a power converter, in particular an inverter, according to claim 10.

12. A vehicle, in particular an electric vehicle or hybrid vehicle, comprising an electric axle drive according to claim 11.

* * * * *